United States Patent [19]

Davis

[11] Patent Number: 4,468,746

[45] Date of Patent: Aug. 28, 1984

[54] APPARATUS FOR DETERMINING INTERVAL BETWEEN TWO EVENTS

[75] Inventor: R. M. Davis, West Chester, Ohio

[73] Assignee: Cincinnati Electronics Corporation, Cincinnati, Ohio

[21] Appl. No.: 326,390

[22] Filed: Dec. 1, 1981

[51] Int. Cl.³ ........................ G04F 8/00; H03K 5/159

[52] U.S. Cl. ........................................ 364/569; 377/20

[58] Field of Search ............................ 377/19, 20, 26; 364/569; 368/101

[56] References Cited

U.S. PATENT DOCUMENTS 2,831,126 4/1958 Gross .................................. 377/20

*Primary Examiner*—Errol A. Krass

*Assistant Examiner*—Edward R. Cosimano

*Attorney, Agent, or Firm*—Lowe, King, Price & Becker

[57] ABSTRACT

The interval between first and second events, which may occur in a period less than a nanosecond interval, is determined with a square wave clock source started in response to the first event. The source derives a square wave having a first transition when started and equally spaced succeeding transitions spaced from each other by T/2, where T is the square wave period. A delay network having N taps is responsive to the square wave, whereby (N+1) square waves are derived. The taps are spaced from each other so the clock source square wave is delayed at tap k by kT/n, where n is a predetermined integer greater than 1 and k is selectively every integer from 1 to N. (N+1) memory elements respectively respond to the (N+1) square waves to generate a signal indicative of which half cycle of each of the (N+1) square wave is being derived when the second event occurs.

12 Claims, 2 Drawing Figures

APPARATUS FOR DETERMINING INTERVAL BETWEEN TWO EVENTS

TECHNICAL FIELD

The present invention relates generally to a device for determining the interval between first and second events, and more particularly to such a device including a clock source which is started when the first event occurs and drives a delay element.

BACKGROUND ART

For many applications it is necessary to provide a device for measuring the time interval between first and second events. If the first and second events are time spaced from each other by an extremely short duration, such as less than one nanosecond or on the order of a few nanoseconds, there are manifold problems in determining the interval between the events.

Prior art devices have been developed to determine the time interval between first and second events spaced from each other on the order of a nanosecond. In one device analog interpolators measure and reduce a $\pm 1$ count ambiguity. In this technique, three separate measurements are made to determine the interval between a start pulse (first event) and a stop pulse (second event). The first measurement determines a first time interval between the first event and the first reference clock pulse that occurs after the first event and a second interval between the second event and the first reference clock pulse which occurs after the second event. The first and second time intervals are determined by stretching the intervals in separate analog pulse stretcher networks. The pulse stretchers derive pulses having widths that are linearly proportional to the time separating the pulses applied to them. The total time interval between the first and second events is determined by adding together the first two measurements and subtracting the resultant sum from the third measurement.

In a second technique, described fully in the Hewlett-Packard Journal for August, 1978, and referred to as Dual Vernier Interpolation, two triggered phase-lock oscillators are responsive to the first and second events. Output signals from the two triggered oscillators are combined. Extensive computations are performed by circuitry responsive to the combined signals from the triggered oscillators to derive the desired time interval.

Both of the prior art structures are relatively bulky and expensive and employ methods requiring stretching of a time base. This prevents multiple stop pulses from being received prior to completion of the interpolation time. Thus, the prior art devices are not suitable to many systems in which a last return for stop pulse timing is required. The duty cycle of the prior art systems is limited by the interpolation time of the circuitry included therein; because the interpolation time is normally on the order of a milisecond, the prior art systems are not suitable to detect multiple events that occur more frequently than on the order of a millisecond. The prior art devices also consume a relatively great amount of power and require analog components, rather than standard, available digital components.

It is, accordingly, an object of the present invention to provide a new and improved apparatus for determining the interval between first and second events.

Another object of the invention is to provide a new and improved apparatus for determining the interval between first and second events which may occur on the order of a nanosecond from each other.

Another object of the invention is to provide a new and improved relatively low volume, low power consuming device using standard, available digital components for determining the interval between first and second events that can occur on the order of a nanosecond or less relative to each other.

A further object of the invention is to provide a new and improved apparatus for determining the interval between first and second events that occur within each other on the order of a nanosecond, wherein a direct indication of the time interval is provided without making computations.

DISCLOSURE OF INVENTION

In accordance with one aspect of the present invention, the interval between first and second events, which may occur within a nanosecond or less of each other, is determined by apparatus including a clock source and a delay means. The clock source is started in response to the first event to derive a wave having a first transition when started and equally spaced succeeding transitions spaced from each other by T/2. The delay means respond to the clock source wave and includes N taps. At each tap is derived a delayed wave having a period T with equal length half cycles, where N is a predetermined integer greater than 1. The taps are spaced from each other so the wave is delayed at tap k by kT/n, where n is a predetermined integer greater than 1 and k is selectively every integer from 1 to N. In response to the wave derived at tap g, there is derived a signal indicative of which half cycle of the delayed wave is being derived at tap g when the second event occurs, where g is selectively every integer from 1 to N. In response to the clock source, there is derived a signal indicative of whether an even or odd number of the clock wave transitions have occurred when the second event occurs. The signals indicative of which half cycle of the delayed wave is being derived at tap g and indicative of whether an even or odd number of clock wave transitions have occurred when the second event occurs indicate, with a resolution greater than the interval between transitions of the clock source, what the interval is between the first and second events. Thus, the input to the delay means and the N taps of the delay means divide adjacent transitions of the clock source into (N+1) segments. Thus, for example, a 125 Megahertz clock source, having a period of 8 nanoseconds, and a delay element having three taps, each spaced one nanosecond from each other, can resolve the time between first and second events into a one nanosecond interval.

To derive the signal indicative of which half cycle of the delayed wave is being derived at tap g when the second event occurs, a memory element responds to the delayed wave at tap g when the second event occurs. To derive the signal indicative of whether an even or odd number of transitions of the clock source wave occurred between the first and second events, a further memory element responds to the clock source wave when the second event occurs.

In a preferred embodiment, the clock source is a square wave and a replica of the clock source square wave is derived at each tap, whereby (N+1) square waves are derived. A signal indicative of which half cycle of each of the (N+1) square waves is being derived when the second event occurs is thus provided.

A binary signal indicative of the interval between the first and second events is preferably derived. The binary signal is generated by a decoder responsive to the signals indicative of which half cycle of the delayed wave is being derived and the signal indicative of whether an even or odd number of clock pulse transitions have occurred, i.e., the (N+1) square waves. The binary signal has $(1+\log_2(N+1))$ bits, where N is such that $\log_2(N+1)$ is a positive integer greater than 1, and $(N+1)\,2T/n$ is equal to one period of the clock source.

To enable the time between the first and second events to be determined if the events are spaced from each other by an interval greater than the length of one cycle, i.e., two transitions, of the clock source, a counter responds to alternate transitions of the clock source to derive a multi-bit signal. The least significant bit of the signal derived by the counter signifies a time resolution equal to one period of the clock source.

It is, accordingly, still another object of the present invention to provide a new and improved apparatus for determining the interval between first and second events by employing a clock source having a period which can be greater than the interval between the first and second events.

A further feature of the invention is that the (N+1) bit signal derived from the clock source and the N tap delay circuit is a "Walking Gray Code" since a transition between adjacent sub-intervals results in a change of only one bit of the (N+1) bit signal.

A further feature of the invention is that it enables, with minor modification, first stop pulse selection or last stop pulse selection, i.e., first event selection or second event selection, or "lap" strobbing.

The above and still further objects, features and advantages of the present invention will become apparent upon consideration of the following detailed description of one specific embodiment thereof, especially when taken in conjunction with the accompanying drawings.

BEST MODE FOR CARRYING OUT THE INVENTION

Figure 1:
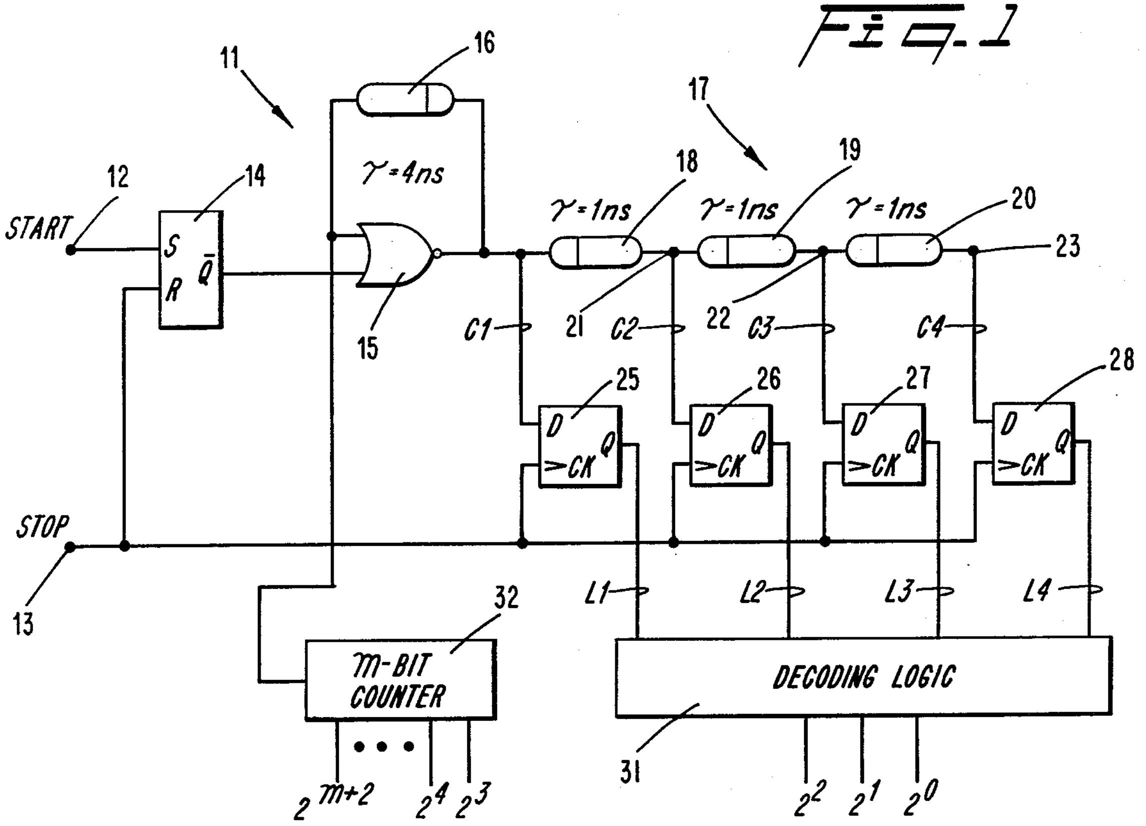
FIG. 1 is a circuit diagram of a preferred embodiment of the invention.
Figure 2:
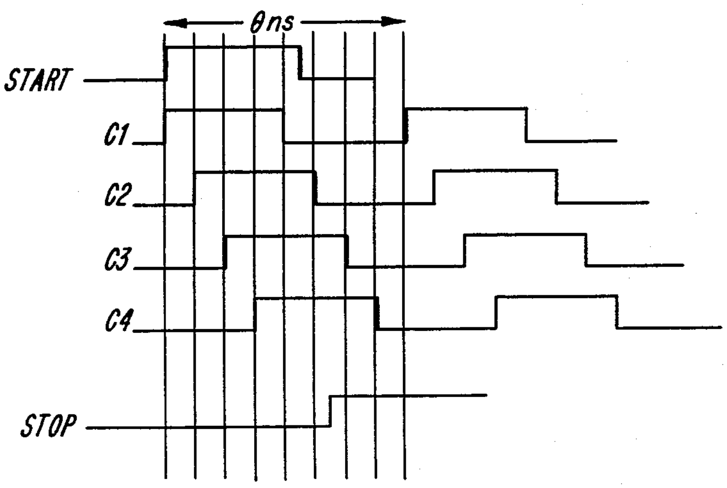
FIG. 2 represents a series of wave forms used for describing the operation of the circuit of FIG. 1.

Reference is now made to FIG. 1 of the drawing wherein gated clock source 11 is activated in response to a start pulse (first event) at terminal 12 and deactivated in response to a stop pulse (second event) at terminal 13. The pulses at terminals 12 and 13 are respectively applied to set (S) and reset (R) terminals of flip-flop 14 that is a part of the gated clock source, i.e., oscillator, 11. Flip-flop 14 includes a complementary ($\overline{Q}$) output terminal having a binary one value in response to flip-flop 14 being in a reset state in response to a pulse occurring at terminal 13. The $\overline{Q}$ output of flip-flop 14 is applied to one input of NOR gate 15, having an output which is coupled back to a second input of the NOR gate by way of delay element 16. NOR gate 15 and delay element 16 form gated clock source 11. In a preferred embodiment, delay element 16 introduces a delay time of four nanoseconds, whereby each transition at the output of NOR gate 15 is coupled back to the input of the NOR gate by way of the delay element four nanoseconds after the output transition occurs. In the interval between the occurrence of start and stop pulses at terminals 12 and 13, gated clock source 11 derives, at the output terminal of NOR gate 15, square wave $C_1$, as illustrated in FIG. 2.

Square wave $C_1$ has a positive going transition that occurs substantially simultaneously with flip-flop 14 being activated to the set state in response to the signal at start terminal 12. A negative transition in the square wave occurs T/2 seconds after the positive going transition, where T/2 is the delay time of delay element 16. A second positive going transition occurs in wave $C_1$ at the output of NOR gate 15 T/2 seconds after the first negative going transition. Such transitions in square wave $C_1$ are repeated every T/2 seconds until flip-flop 14 is reset in response to the signal at terminal 13. Thus, gated clock source 11 derives a square wave having a period of T seconds, with a first transition occuring when the first event occurs and subsequent transitions equally spaced from each other by T/2.

The square wave output of gated clock source 11 is applied to delay line 17. Delay line 17, in the illustrated embodiment includes three delay elements 18, 19 and 20, each having a delay time of T/n, where n is a predetermined integer greater than 1. In the illustrated embodiment, T=8 nanoseconds and n=8, whereby the delay time of each of elements 18, 19 and 20 is one nanosecond; thus, n is an integer having a value dependent on the resolving capability of the device to determine the length of the interval between the start and stop pulses as a fraction of the period T of the square wave derived by clock 11. Thereby at output taps 21, 22 and 23 of delay elements 18, 19 and 20 are respectfully derived square wave replicas $C_2$, $C_3$ and $C_4$ (FIG. 2), having transitions synchronized with, but delayed from those of wave form $C_1$ by 1, 2 and 3 nanoseconds, respectively. Generalizing, the signal derived at tap k is delayed by k T/n relative to the wave derived at the output of NOR gate 15 of gated clock source 11.

The binary value of signals $C_1$–$C_4$ at the occurrence time of the second event, i.e., when the stop pulse is applied to terminal 13, indicates the interval between the first and second events. For the situation illustrated in FIG. 2, wherein the stop pulse is applied to terminal 13 between five and six nanoseconds after application of the leading edge of the start pulse to terminal 12, signals $C_1$ and $C_2$ both have binary zero values, while signals $C_3$ and $C_4$ both have binary one values at the occurrence time of the second event. This 1100 combination of values for signals $C_1$–$C_4$ can be detected and decoded to enable the time interval between the first and second events to be determined with a resolution greater than the eight nanosecond period of gated clock source 11.

To these ends, the output of gated clock source 11, at NOR gate 15, (signal $C_1$) and the signals at taps 21, 22 and 23 (signals $C_2$, $C_3$ and $C_4$) are respectively applied to D input terminals of data or delay (D) flip-flops 25–28. Each of flip-flops 25–28 includes a clock (CK) input responsive to the stop signal at terminal 13. Each of flip-flops 25–28 responds to the positive transition at stop terminal 13 to derive a signal indicative of the binary value applied to the D input of the flip-flop when the positive transition of the stop signal at terminal 13 occurs. In other words, each of flip-flops 25–28 functions as a memory element for deriving a signal indicative of which half cycle of the (N+1) square waves $C_1$–$C_4$ is being derived when the second event occurs. In essence, flip-flop 25 derives a signal indicative of whether an even or odd number of transitions occur at the output of gated clock source 11 between the first and second events. In response to an odd number of transitions occurring in signal $C_1$ between the first and second events, flip-flop 25 derives a binary one value; if an even number of transitions of clock source 11 occur in the interval between the first and second events, flip-flop 25 derives a binary zero output level.

The binary signals at the outputs of flip-flops 25–28 are supplied to decoding logic network 31. Decoding logic network 31 responds to the input signal thereof to derive a multi-bit binary output signal. For the particular illustrated situation wherein four signals are supplied by flip-flops 25–28 to decoding logic network 31, the decoding logic network derives a three bit signal having values commensurate with $2^0$, $2^1$, and $2^2$.

For the general situation, wherein delay network 17 has N taps and (N+1) input signals are applied to decoding logic network 31, the decoding logic network derives a binary signal having $(1+\log_2(N+1))$ bits, N has a value such that $\log_2(N+1)$ is a positive integer greater than 1, and (N+1) 2T/n is equal to one period of the clock source. In the particular, illustrated embodiment, N=3, whereby $\log_2(N+1)=\log_2(3+1)=\log_2 4=2$, whereby decoding logic network 31 derives a binary signal having 1+2=3 parallel bits.

To enable an accurate indication to be determined of the intervals between the first and second events if the events are spaced from each other by an interval greater than the period of gated clock source 11, each cycle of clock source 11 is counted between the time that flip-flop 14 is activated in the set state. To this end, the signal coupled by delay element 16 to the input of NOR gate 15 is also coupled in parallel to m-bit counter 32. Counter 32 responds to each positive going transition applied by delay element 16 to the input of NOR gate 15. Thereby, in response to completion of each cycle of gated clock source 11, the count of counter 32 is incremented by one. For the particular situation in FIG. 1, the most significant bit output of m-bit counter 32 is associated with an interval of $2^{(m+2)}$ time units. Generalizing for a decoding logic network 31 that derives a p bit binary output signal, the most significant bit of m-bit counter 32 is associated with a time of $2^{(m+p-1)}$ time units.

While there has been described and illustrated one specific embodiment of the invention, it will be clear that variations in the details of the embodiment specifically illustrated and described may be made without departing from the true spirit and scope of the invention as defined in the appended claims.

I claim:

1. Apparatus for determining the interval between first and second events comprising a clock source started in response to the first event, said source deriving a wave having a first transition when started and equally spaced succeeding transitions spaced from each other by T/2, delay means responsive to the wave, said delay means having N taps, each deriving a delayed wave having a period T with equal length half cycles, where N is a predetermined integer greater than 1, said taps being spaced from each other so the wave is delayed at tap k by kT/n, where n is a predetermined integer greater than 1 and k is selectively every integer from 1 to N, means responsive to the delayed wave derived at tap g for deriving a signal indicative of which half cycle of the delayed wave is being derived at tap g when the second event occurs, where g is selectively every integer from 1 to N, and means responsive to the clock source for deriving a signal indicative of whether an even or odd number of clock source transitions occurs between the first and second event.

2. The apparatus of claim 1 wherein the means for deriving the signal at tap g comprises a memory element which responds to the delayed wave at tap g when the second event occurs, and the means for deriving a signal indicative of an even or odd number of transitions comprises a further memory element which responds to the clock source wave when the second event occurs.

3. The apparatus of claim 1 or 2 further including decoding means responsive to the signals indicative of which half cycle of the delayed wave is being derived and the signal indicative of whether an even or odd number of transitions occurs for deriving a binary signal indicative of the interval between the first and second events, said binary signal having $(1+\log_2(N+1))$ bits, N being such that $\log_2(N+1)$ is a positive integer greater than 1, wherein (2(N+1)T)/n is equal to one period of the clock source.

4. The apparatus of claim 3 further including a counter responsive to alternate transitions of the clock source for deriving a multi-bit binary signal, the least significant bit signal derived by the counter signifying a time resolution equal to one period of the clock source.

5. The apparatus of claim 1 or 2 wherein (2(N+1)T)/n is equal to one period of the clock source.

6. Apparatus for determining the interval between first and second events comprising a square wave clock source started in response to the first event, said source deriving a wave having a first transition when started and equally spaced succeeding transitions spaced from each other by T/2, delay means responsive to the clock source square wave, the delay means having N taps, each deriving a delayed replica of the clock source square wave, whereby (N+1) square waves are derived, where N is a predetermined integer greater than 1, said taps being spaced from each other so the wave is delayed at tap k by kT/n, where n is a predetermined integer greater than 1 and k is selectively every integer from 1 to N, and means responsive to the (N+1) square waves for deriving a signal indicative of which half cycle of each of the (N+1) square waves is being derived when the second event occurs.

7. The apparatus of claim 6 wherein the means for deriving a signal indicative of which half cycle of each of the (N+1) square wave is being derived comprises (N+1) memory elements respectively responsive to the binary values of the (N+1) square waves when the second event occurs.

8. The apparatus of claim 7 further including decoding means responsive to the binary values of the (N+1) square waves for deriving a multi-bit binary signal indicative of the interval between the first and second events, said binary signal having $(1+\log_2(N+1))$ bits, N being such that $\log_2(N+1)$ is a positive integer greater than 1, wherein [N+1)T/n](2(N+1)T/n is equal to one period of the clock source.

9. The apparatus of claim 8 further including a counter for counting the number of cycles of the clock source between the first and second events for deriving a multi-bit binary signal, the least significant bit of the signal derived by the counter signifying a time resolution equal to one period of the clock source.

10. The apparatus of claim 6 or 7 wherein (2(N+1)T)/n is equal to one period of the clock source.

11. Apparatus for determining the interval between first and second events comprising a gated oscillator for deriving a first square wave having a period T, the gated oscillator being respectively started and stopped in response to the first and second events, a delay line responsive to the first square wave for deriving N delayed square waves, delayed square wave k being delayed from the first square wave by kT/n, where k is selectively each of 1 . . . N and n is an integer greater than one, and decoding means responsive to the binary values of the first square wave and the N delayed square waves when the second event occurs for deriving a multi-bit binary signal having a value indicative of the length of the interval between the first and second events as a fraction of the period T.

12. The apparatus of claim 11 further including a counter responsive to a replica of the first square wave delayed by T/2 for deriving a binary signal having a value indicative of the whole number of cycles having a period T between the first and second events.

* * * * *